US006238992B1

(12) United States Patent
Yamada

(10) Patent No.: US 6,238,992 B1
(45) **Date of Patent: *May 29, 2001**

(54) METHOD FOR MANUFACTURING RESISTORS

(75) Inventor: Hiroyuki Yamada, Fukui (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/228,222

(22) Filed: Jan. 11, 1999

(30) Foreign Application Priority Data

Jan. 12, 1998 (JP) ........................................ 10-003667

(51) Int. Cl.[7] .......................... H01L 21/20; H01C 7/00; H01C 1/012

(52) U.S. Cl. ........................ 438/382; 338/203; 338/307; 338/308

(58) Field of Search ................................ 438/381, 382, 438/383, 384, 385; 338/309, 307, 308, 313, 320, 203

(56) References Cited

U.S. PATENT DOCUMENTS

| | | | | |
|---|---|---|---|---|
| 5,334,968 | * | 8/1994 | Negoro | 338/320 |
| 5,379,190 | * | 1/1995 | Hanamura et al. | 361/766 |
| 5,850,171 | * | 12/1998 | Lin et al. | 338/320 |
| 6,023,217 | * | 2/2000 | Yamada et al. | 338/309 |

FOREIGN PATENT DOCUMENTS 4-357801 12/1992 (JP) .

* cited by examiner

*Primary Examiner*—John F. Niebling
*Assistant Examiner*—Viktor Simkovlc
(74) *Attorney, Agent, or Firm*—Ratner & Prestia

(57) ABSTRACT

A method for manufacturing resistors comprising the steps of forming a top electrode layer on a top face of a substrate, a resistance pattern connected to the top electrode layer, a protective layer covering the resistance pattern, a thin metal film side electrode layer on a side face of the substrate which is electrically connected to the top electrode layer, and a concavity by removing a part of the side electrode layer and substrate.

16 Claims, 5 Drawing Sheets

METHOD FOR MANUFACTURING RESISTORS

FIELD OF THE INVENTION

The present invention relates to a method for manufacturing resistors generally used in electronic circuits.

BACKGROUND OF THE INVENTION

There is an increasing demand for rectangular chip resistors with highly accurate resistance to eliminate adjustment for electronic circuits as the size of electronic equipment continues to shrink. In particular, since the allowance required for the resistance of rectangular chip resistors is in the range of ±0.5% to ±0.1%, the demand for rectangular chip resistors made of thin metal film resistance, in which precise resistance is achieved more easily, is overtaking demand for conventional rectangular chip resistors which are constituted of thick film resistance made of grazed material.

Furthermore, the demand for multiple chip resistors, which are packages of two or more rectangular chip resistors, is increasing as a result of the need to increase the mounting density of electronic components on circuit boards. In the field of multiple chip resistors, the demand for thin film multiple chip resistors with a thin metal resistance (hereafter referred to as "resistors") is also overtaking demand for conventional multiple chip resistors with thick film resistance.

A conventional method for manufacturing resistors is explained below with reference to FIG. 4.

First, a substrate 21 made of 96% aluminum is supplied (Process A). The substrate 21 has an a surface a horizontal division groove (slit) 22 and vertical division grooves (slit) 23 at constant intervals so as to configure two or more resistance elements. Through holes 24 are provided in the horizontal division groove 22. A thin film top electrode layer 25, typically of Au, is formed on the top face of the substrate 21 across the horizontal division grooves 22 and at both sides of the through holes 24 (Process B).

Then, a thin film bottom electrode layer (not illustrated), typically of Au, is formed on the bottom face of the substrate 21 at a position corresponding to the top electrode layer 25 (Process C).

A thin film resistance layer 26 typically of NiCr is formed over the entire top face of the substrate 21 (Process D).

The thin film resistance layer 26 is then etched using photolithography, so as to leave a portion of the thin film resistance layer 26 connected to the top electrode layer 25 to form a pattern of a resistance 27 (Process E).

The resistance is corrected, by means such as a YAG laser, to adjust the resistance 27 to a specified value (Process F).

A resin paste, made typically of epoxy resin, is printed to completely cover an adjusted resistance 28, and then cured to form a protective layer 29 (Process G).

The substrate 21 is then primarily cut along the horizontal division groove 22 (Process H). A thin film side electrode layer 31 made of Ni system is formed on a cut face of the primary divided substrate 30 by means such as sputtering (Process I). Here, the side electrode layer 31 is formed only on the cut face of the primary divided substrate 30. It is not necessary to form the side electrode layer 31 on a side face of the through hole 24, which separates adjacent electrodes. Accordingly, a resist is applied to the side face of the through holes 24 before forming the side electrode layer 31, and the resist is removed after sputtering a thin Ni film by means such as the lift-off method in order to form the side electrode layer 31 only on the cut face.

Next, the substrate, after the side electrode layer is formed, is cut along the vertical division grooves 23 (secondary division) to make substrate pieces (Process J).

Lastly, an electrode plating layer 33 is formed on the entire face of the top electrode layer 25, bottom electrode layer, and side electrode layer 31 of a substrate piece 32 (Process K).

In the process of applying resist to the through holes 24 in the prior art, however, the resist may not be fully applied to the side face of the through holes 24 due to deviations. As a result, electrode material may attach to a part of the side face of the through holes 24 when forming a side electrode layer 31, as shown in FIG. 5, creating an electrode material spill 38. This causes short circuits between electrodes or solder bridges during soldering.

SUMMARY OF THE INVENTION

A method for manufacturing resistors of the present invention comprises the steps of forming more than one top electrode layer on a top face of a rectangular substrate, forming at least one resistance layer so as to electrically connect with said more than one top electrode layer, forming a protective layer so as to cover at least said resistance layer, forming a side electrode layer on a side face of said substrate so as to electrically connect with said top electrode layer, and separating said adjacent top electrode layers by removing a part of said side electrode layer and said substrate.

In this manufacturing method, a part of the substrate is removed after forming the side electrode layer so as to create a concavity, which separates the top electrode layers, between adjacent electrodes. Accordingly, the resistor manufacturing method of the present invention eliminates the possibility of attachment of an electrode material to the concavity, enabling to prevent short circuits between adjacent electrode terminals and the occurrence of solder bridges during soldering.

DESCRIPTION OF THE PREFERRED EMBODIMENTS

First Exemplary Embodiment

A method for manufacturing resistors in accordance with a first exemplary embodiment of the present invention is explained with reference to drawings.

Figure 1:
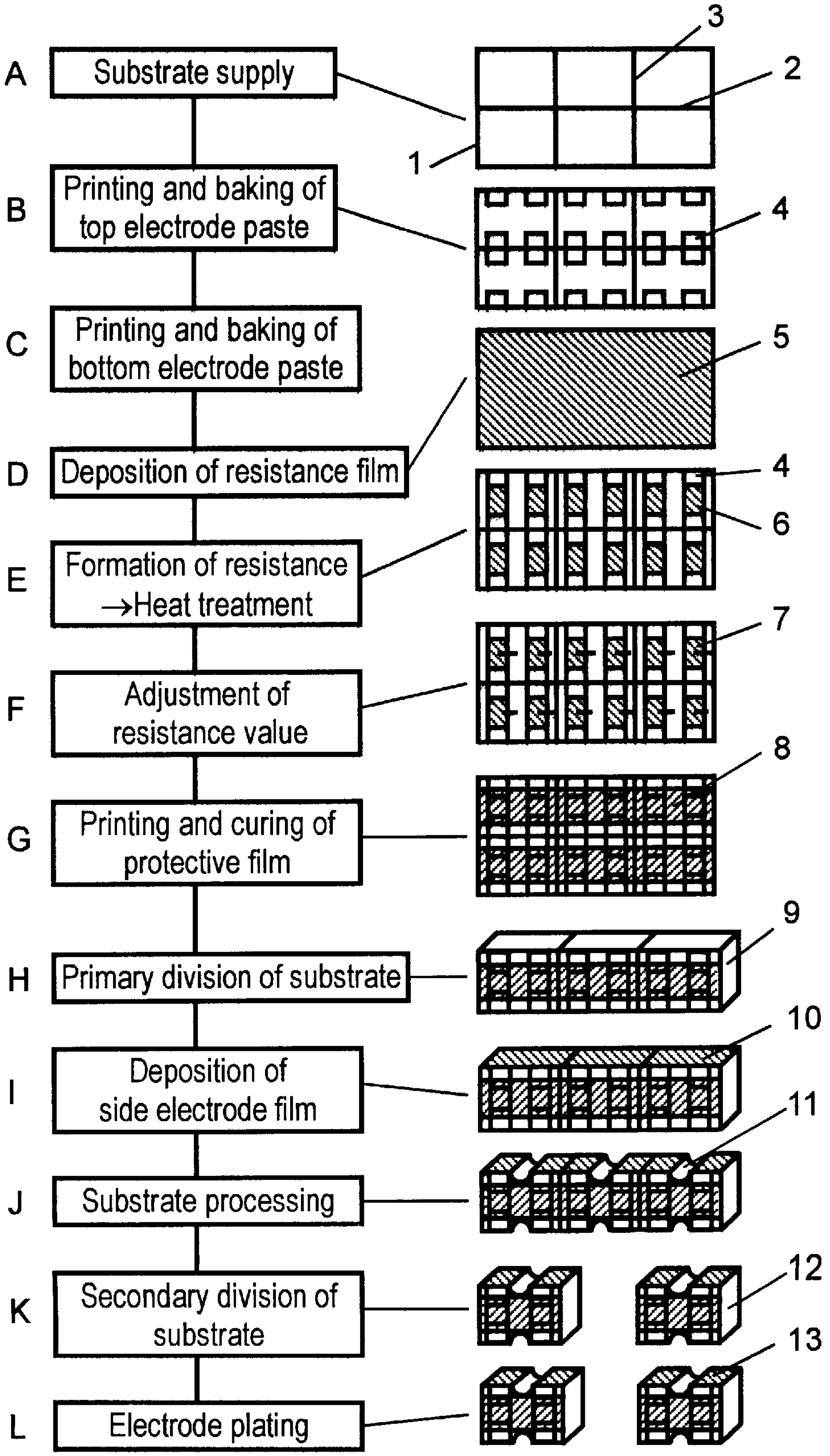
FIG. 1 is a process flow chart illustrating a method for manufacturing resistors in accordance with a first exemplary embodiment of the present invention.

As shown in FIG. 1, a sheet substrate 1 is supplied of 96% aluminum with good heat resistance and insulation, and whose surface is divided by a horizontal division groove (slit) 2 and vertical division groove (slit) 3 at a constant interval (Process A).

After screen printing a conductive paste, such as an organic metal mainly consisting of Au, on the top face of the substrate 1 across the horizontal division groove 2, the substrate 1 is baked at 850° C. for 45 minutes in a conveyor-type continuous baking furnace to form a thin film top electrode layer 4 (Process B).

Using the same method, a thin Au film is formed as a bottom electrode layer (not illustrated) on the bottom face of the substrate 1 at a position corresponding to the top electrode layer 4 (Process C).

Then, a thin film resistance layer 5, typically of NiCr, is sputtered onto the entire top face of the substrate 1 (Process D). A resistance 6 is formed by etching the thin film resistance layer 5 using photolithography, so as to leave a portion of the thin film resistance layer connected to the top electrode layer 4. To stabilize a film of the resistance 6, heat treatment is applied to the substrate 1 at approximately 300 to 400° C. for approximately 5 to 6 hours (Process E).

Next, a trimming groove is provided on the resistance 6 using a YAG laser to adjust the resistance to a specified value (Process F).

A resin paste, made typically of epoxy resin, is then screen printed to cover the entire adjusted resistance 7. The substrate 1 is cured in a conveyor-type continuous curing furnace at approximately 200° C. for approximately 30 minutes to adhere the resin paste firmly onto the substrate 1 and form a protective layer 8, with a thickness of approximately 20 $\mu$m (Process G).

The substrate 1 is then cut along the horizontal division groove 2 to form a primary divided substrate 9 (Process H).

On the side faces of both ends of the primary divided substrate 9, a thin Ni system or Cu system metal film is sputtered to form a side electrode layer 10 which electrically connects the top electrode layer 4 and the bottom electrode layer (Process I).

Next, a part of the primary divided substrate 9 and the side electrode layer 10, formed on the side faces of both ends of adjacent top electrode layers 4 on the primary divided substrate 9, is removed by dicing to form a concavity 11 (Process J).

The primary divided substrate 9 is cut along the vertical division groove 3 to form a substrate piece 12 (Process K).

Lastly, the surfaces of the top electrode layer 4, bottom electrode layer, and side electrode layer 10 are plated with nickel, and then soldered to form an electrode plating layer 13 (Process L).

With the first exemplary embodiment of the present invention, a concavity is created by removing a part of the substrate after forming the side electrode layer, in order to electrically separate adjacent electrodes. Accordingly, no electrode material attaches to the concavity, securing electrical insulation and preventing short circuits between adjacent electrode terminals. The occurrence of solder bridges during soldering may also be prevented. Furthermore, degradation of insulation due to resist remaining on the side face of the concavity can be prevented, because no resist is applied in the exemplary embodiment.

In the first exemplary embodiment, dicing is adopted to form the concavity by removing a part of the substrate. However, the same purpose can be achieved by other methods, such as evaporation using a laser beam.

The exemplary embodiment also explains the case of forming a resistor using a thin metal film resistance as resistance material. This does not intend to limit the materials used for the resistance in the present invention. For example, thick film resistance can also be used for forming the resistor related to the present invention. This enables the creation of a resistor with highly accurate resistance.

The first exemplary embodiment also uses the sheet substrate 1 with division grooves on its surface. However, a substrate without grooves is also applicable.

The exemplary embodiment also explains the case when there are two independent resistances in a single chip (so-called double-resistance chip), as shown in FIG. 1. However, a resistor with three or more resistances (triple-resistance chip or above) or a resistor with parallel resistances sharing a common terminal electrode can also be manufactured using the present invention. In addition, if a resistor has two or more electrode terminals, a composite passive device including a capacitor can be manufactured, gaining the same effect.

In the exemplary embodiment, the side electrode layer is formed by sputtering. However, other thin film forming methods such as vacuum evaporation, ion plating, and thermal spraying can be used to form the side electrode layer to achieve the same effect.

Second Exemplary Embodiment

A method for manufacturing resistors in accordance with a second exemplary embodiment of the present invention is explained with reference to FIGS. 2 and 3.

The method for manufacturing resistors in this exemplary embodiment is largely the same as that of the first exemplary embodiment shown in FIG. 1. The only details that differ from those of the first exemplary embodiment, i.e., Process I and Process J, are explained next with reference to FIGS. 2 and 3.

First, the primary divided substrate 9 is created according to the same processes A to H shown in FIG. 1 as the first exemplary embodiment.

Figure 2:
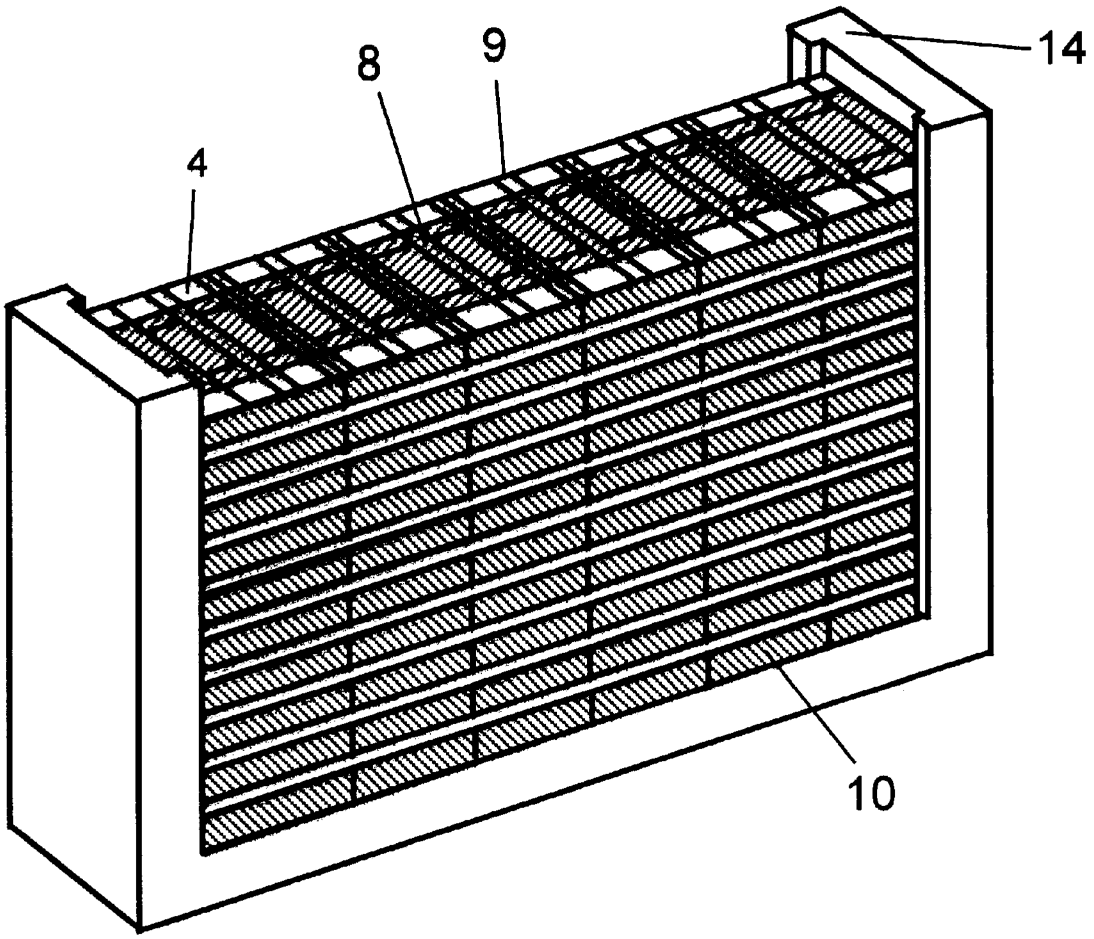
FIG. 2 is a perspective view illustrating the formation of a side electrode layer in accordance with a second exemplary embodiment of the present invention.
Figure 3:
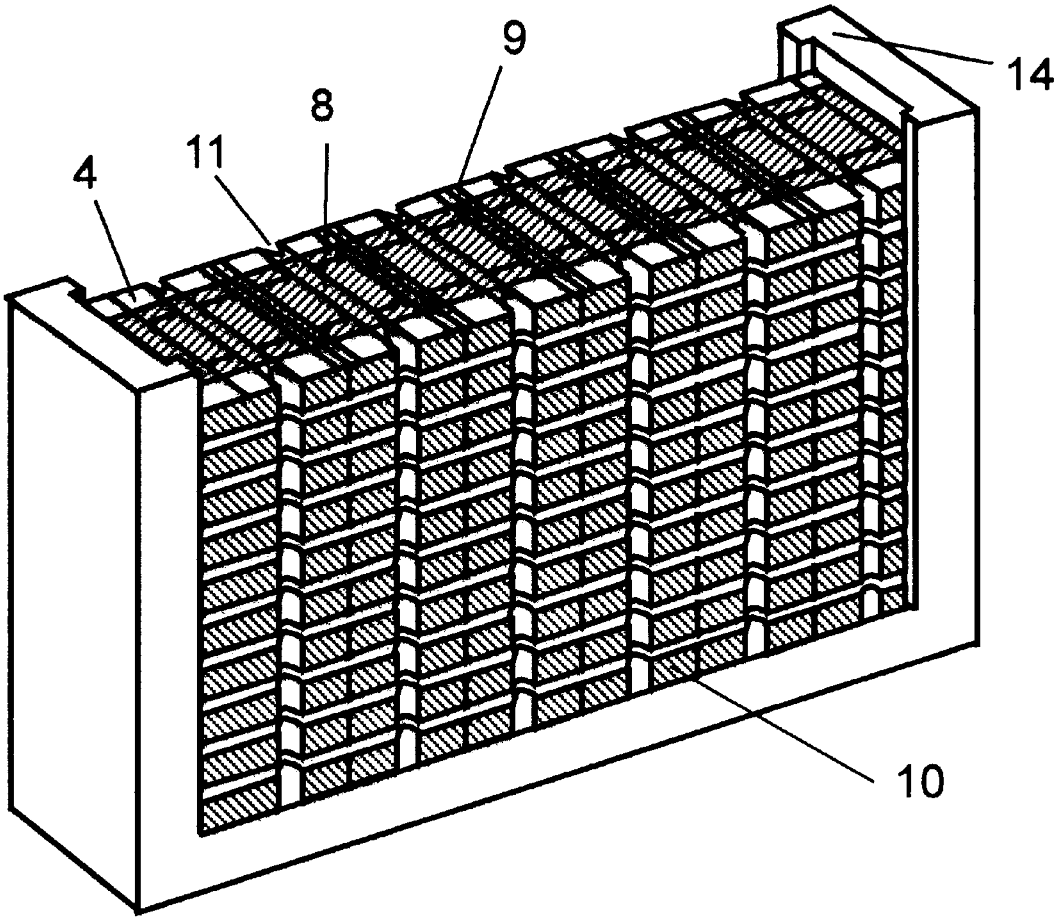
FIG. 3 is a perspective view illustrating the formation of a concavity.
Figure 4:
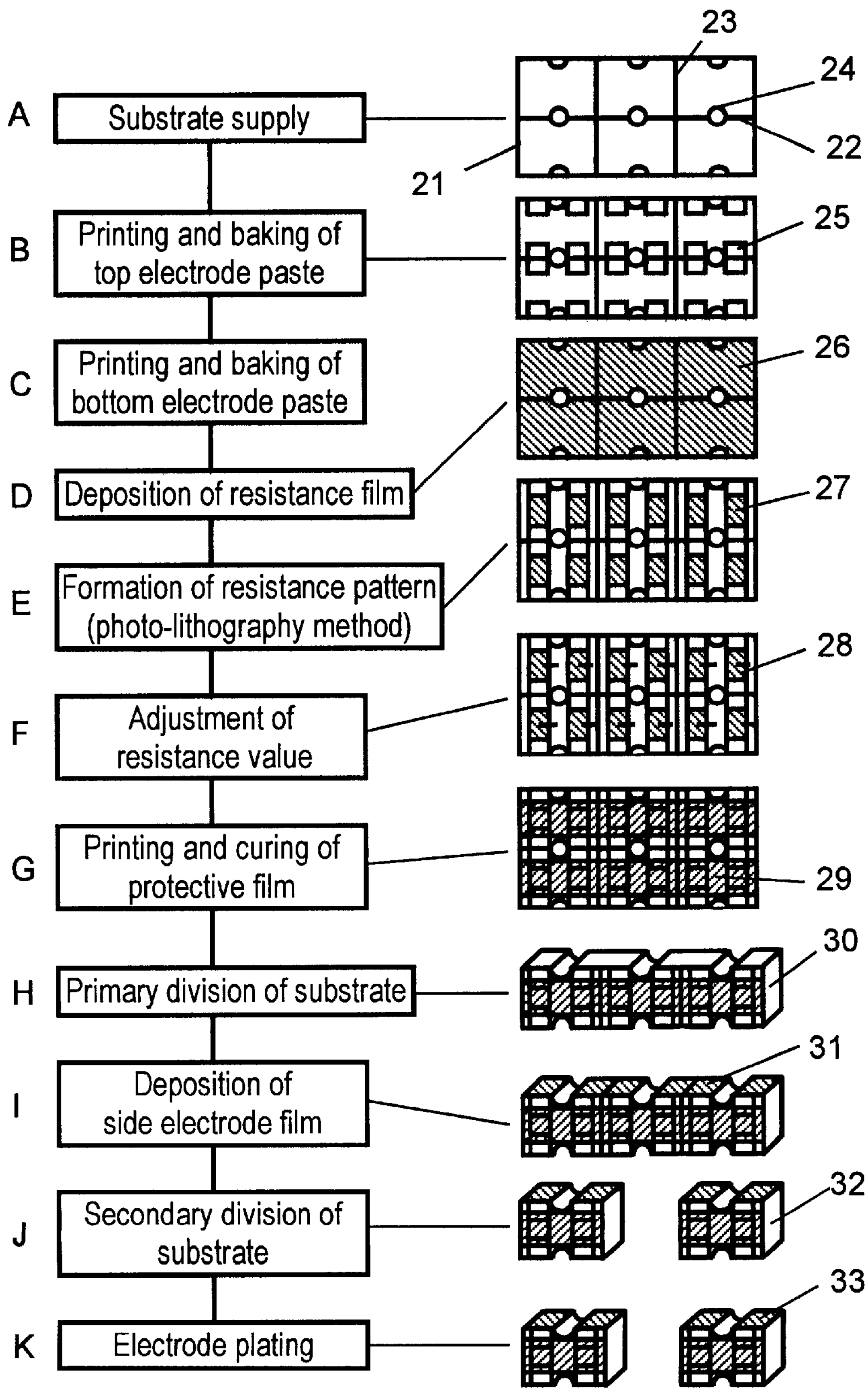
FIG. 4 PRIOR ART
FIG. 4 is a process flow chart illustrating a prior art method for manufacturing resistors.
Figure 5:
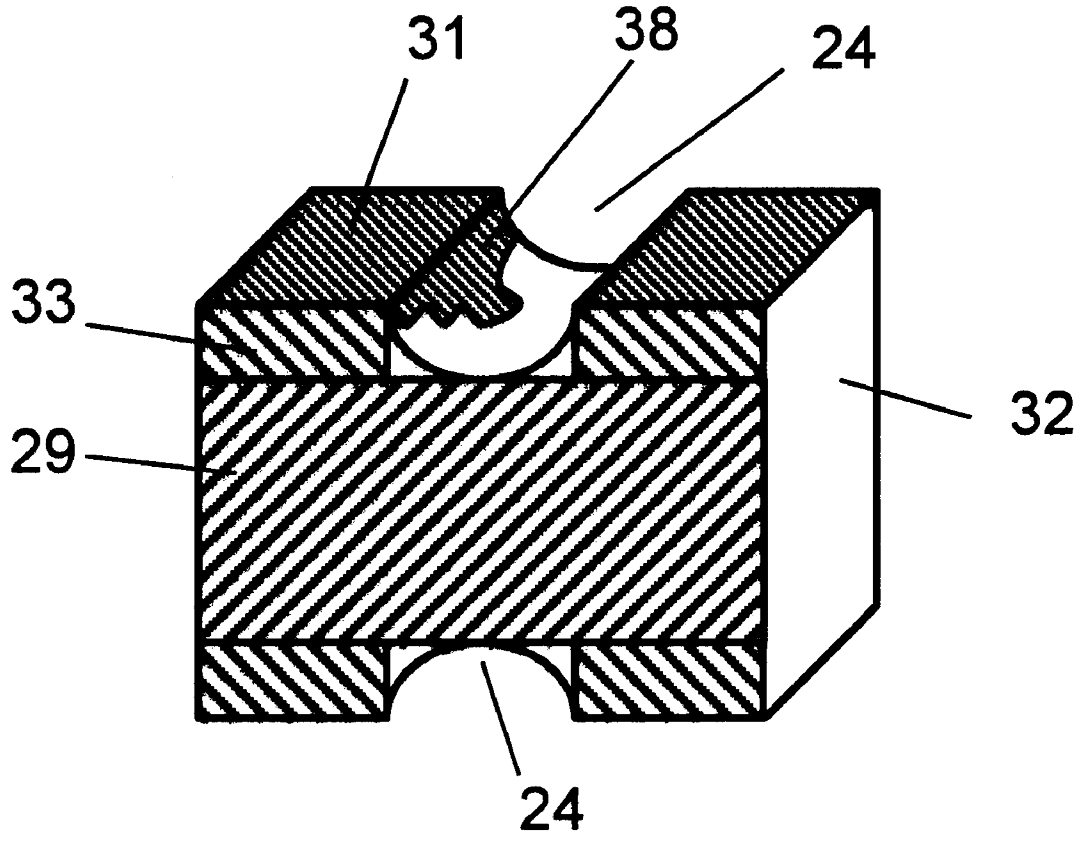
FIG. 5 PRIOR ART
FIG. 5 is a perspective view of a prior art resistor.

In Process I, as shown in FIG. 2, a plurality of primary divided substrates 9 are stacked in a substrate holder 14. Then, a thin Ni system metal film is sputtered onto the side face of the primary divided substrates 9, forming the side electrode layer 10, so as to electrically connect the top electrode layer 4 and the bottom electrode layer.

In Process J, the concavity 11 is created by dicing a part of the primary divided substrates 9 and the side electrode layer 10 formed on side faces of both ends of adjacent top electrode layers 4 on the primary divided substrates 9. Here, as shown in FIG. 3, two or more primary divided substrates 9 on which the side electrode layer 10 is formed are stacked and two or more side faces of both ends of these primary divided substrates 9 are diced simultaneously at an equal pitch. For dicing more than one area, a multi-blade dicer is used whose two or more blades are set to a specified equal pitch.

Processes K and L shown in FIG. 1 are then carried out, resulting in manufacture of the resistor in this exemplary embodiment.

In the second exemplary embodiment, the side electrode layer is formed on more than one primary divided substrate at once, and then the concavity among adjacent electrodes is simultaneously formed on more than one primary divided substrate. Accordingly, it enables efficient production, and prevents the occurrence of short circuits between adjacent electrodes by eliminating attachment of electrode material onto the concavity. The occurrence of solder bridges during soldering can also be prevented.

In addition, accuracy of dimensions of concavities can be improved to gain the self-alignment effect during soldering by simultaneously forming more than one concavity on more than one primary divided substrate.

The method for manufacturing resistors of the present invention thus enables a simpler die structure for manufacturing substrates since there is no need to provide concavities on substrates in advance. This facilitates maintenance of manufacturing equipment, resulting in lower-cost manufacture of substrates.

In the exemplary embodiment of the present invention, the concavity is formed on more than one area of the side face of both ends of the substrates simultaneously. However, it can also be formed one by one.

What is claimed is:

1. A method for manufacturing resistors on a substrate having vertical and horizontal division grooves and a top and a side face, said method comprising the steps of:

screen printing a conductive paste over said top face of the substrate;

forming a plurality of top electrodes on said top face of said substrate;

forming at least one resistance layer electrically coupled with said plurality of top electrodes;

forming a trimming groove on said resistance layer;

forming a protective layer covering at least said resistance layer;

forming a side electrode layer on said side face of said substrate, said side electrode layer electrically coupled with said plurality of top electrodes; and electrically separating adjacent top electrodes (1) by removing a part of said side electrode layer and said substrate away from said vertical division grooves without removing said side electrode layer in the region of said vertical division grooves and (2) by dividing said substrate along said vertical division grooves.

2. The method for manufacturing resistors as defined in claim 1, wherein said side electrode layer is a metal selected from the group consisting of Ni and Cu, and is formed by using a thin film deposition method.

3. The method for manufacturing resistors as defined in claim 2, wherein said thin film deposition method is one selected from the group of sputtering, vacuum evaporation, ion plating, and thermal spraying.

4. The method for manufacturing resistors as defined in claim 1, wherein a plurality of parts of said side electrode layer and said substrate are removed simultaneously.

5. The method for manufacturing resistors as defined in claim 4, wherein said plurality of parts of said side electrode layer and said substrate that are removed simultaneously are removed at an equal pitch.

6. The method for manufacturing resistors as defined in claim 1, wherein there are side electrode layers on opposite sides of said substrate, and parts of said opposite side electrode layers and substrate are removed simultaneously.

7. The method for manufacturing resistors as defined in claim 1, wherein said side electrode layer and said substrate are removed by a dicing process.

8. The method for manufacturing resistors as defined in claim 5, wherein said removal is by a dicing process using a multi-blade.

9. A method for manufacturing resistors on a substrate having vertical and horizontal division grooves, and a top face, said method comprising the steps of:

screen printing a conductive paste on said top face of the substrate;

forming a plurality of top electrodes across a horizontal groove on a substrate;

forming at least one resistance layer on a top face of the substrate to electrically connect with said plurality of top electrodes;

forming a trimming groove on said resistance;

dividing said substrate along said horizontal groove;

forming a side electrode layer on a divided side face of said substrate to electrically couple with said plurality of top electrodes;

electrically separating adjacent top electrodes (1) by removing a part of said side electrode layer and said substrate away from said vertical division grooves without removing said side electrode layer in the region of said vertical division grooves and (2) by dividing said substrate along said vertical division grooves.

10. The method for manufacturing resistors as defined in claim 9, wherein a plurality of substrates having been divided along said horizontal groove are placed in a stack, and said side electrode layer is formed on said plurality of substrates.

11. The method for manufacturing resistors as defined in claim 9, wherein a plurality of substrates, on which said side electrode layer is formed, are placed in a stack and a part of said side electrode layer and said substrate is removed from each of said plurality of substrates.

12. The method for manufacturing resistors as defined in claim 9, wherein a plurality of substrates have each been divided along said horizontal groove and a side electrode layer formed thereon, said plurality of substrates being placed in a stack and a part of said side electrode layer and substrate is removed from each of said plurality of substrates.

13. The method for manufacturing resistors as defined in claim 1 wherein said trimming groove is formed by using a YAG laser to adjust the resistance to a specified value.

14. The method for manufacturing resistors as defined in claim 1 wherein the conductive paste used in the process of screen printing containing organic metal whose ingredient is gold.

15. The method for manufacturing resistors as defined in claim 9, wherein there are side electrode layers on opposite sides of said substrate, and portions of said opposite side electrode layers and substrate are removed simultaneously.

16. A method for manufacturing resistors on a substrate having vertical grooves and horizontal grooves on a top face, said method comprising the steps of:

screen printing a thin film pattern of a plurality of top electrodes across said horizontal grooves on the top face of said substrate using a conductive paste of an organic metal whose ingredient is gold;

forming at least one resistance layer on the top face of said substrate to electrically connect with said plurality of top electrodes;

etching said resistance layer using photolithography;

forming a trimming groove on said resistance layer;

forming a protective layer covering at least said resistance layer using resin paste;

dividing said substrate along said horizontal groove; placing a plurality of substrates divided along said horizontal groove in a stack;

forming a side electrode layer on said plurality of substrates placed in a stack to electrically connect with said plurality of top electrodes, said side electrode layer containing at least one of Ni and Cu, and is formed by using a thin film deposition method;

electrically separating adjacent top electrodes of said plurality of substrates placed in a stack by removing a part of said side electrode layer and said substrates away from said vertical grooves to create a concavity by dicing without removing said side electrode layer in the region of said vertical division grooves; and dividing said substrates along said vertical grooves.

* * * * *